(12) United States Patent
Chang et al.

(10) Patent No.: US 8,367,225 B2
(45) Date of Patent: Feb. 5, 2013

(54) COATING, ARTICLE COATED WITH COATING, AND METHOD FOR MANUFACTURING ARTICLE

(75) Inventors: Hsin-Pei Chang, Tu-Cheng (TW); Wen-Rong Chen, Tu-Cheng (TW); Huan-Wu Chiang, Tu-Cheng (TW); Cheng-Shi Chen, Tu-Cheng (TW); Chuang Ma, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 175 days.

(21) Appl. No.: 12/968,421

(22) Filed: Dec. 15, 2010

(65) Prior Publication Data
US 2012/0028072 A1    Feb. 2, 2012

(30) Foreign Application Priority Data

Jul. 29, 2010    (CN) .......................... 2010 1 0240074

(51) Int. Cl.
*B32B 9/00*    (2006.01)
*C23C 16/00*    (2006.01)
(52) U.S. Cl. ................ 428/697; 204/192.1; 204/192.12; 204/192.15; 204/192.16; 427/299; 427/405; 427/419.1; 427/419.7; 428/212; 428/336; 428/469; 428/472; 428/698; 428/699
(58) Field of Classification Search ............... 204/192.1, 204/192.12, 192.15, 192.16; 427/299, 405, 427/419.1, 419.17; 428/212, 336, 469, 472, 428/697, 698, 699
See application file for complete search history.

(56) References Cited

U.S. PATENT DOCUMENTS

| 4,983,212 A * | 1/1991 | Iyori et al. ....................... 75/244 |
| 6,277,486 B1 * | 8/2001 | Matsubara .................... 428/336 |
| 6,410,121 B1 * | 6/2002 | Abukawa ...................... 428/472 |

FOREIGN PATENT DOCUMENTS

JP    2008-240079    * 10/2008

OTHER PUBLICATIONS

Eigen et al "Microstructures and proprties of nanostructured thermal sprayed coating using high-energy nilled cermet powders" Surface & Coatings Technology 195 (2005) p. 344-357.*
Qi et al "Abrasive wear mechanisms of VPS and HVOF-sprayed TiC-Ni based nanocrystalline coatings" Mat-wiss u. Werkstofftech. 35 No.10/11 (2004) p. 779-784.*

* cited by examiner

*Primary Examiner* — Archene Turner
(74) *Attorney, Agent, or Firm* — Altis Law Group, Inc.

(57) ABSTRACT

A coating includes a deposited layer. The deposited layer is a nickel-titanium carbonitride layer.

13 Claims, 4 Drawing Sheets

COATING, ARTICLE COATED WITH COATING, AND METHOD FOR MANUFACTURING ARTICLE

CROSS-REFERENCE TO RELATED APPLICATIONS

The present application is related to co-pending U.S. patent application Ser. No. 12/968,416), entitled "COATING, ARTICLE COATED WITH COATING, AND METHOD FOR MANUFACTURING ARTICLE", by Zhang et al. This application has the same assignee as the present application and has been concurrently filed herewith. The above-identified applications are incorporated herein by reference.

BACKGROUND

1. Technical Field

The exemplary disclosure generally relates to coatings, and particularly relates to articles coated with the coatings and method for manufacturing the articles.

2. Description of Related Art

Physical vapor deposition (PVD) has conventionally been used to form a coating on metal bases of cutting tools or molds. Materials used as this coating material are required to have excellent hardness and toughness. At present, Titanium nitride (TiN) and Titanium-aluminum nitride (TiAlN) are mainly used as a material satisfying these requirements. However, these coating materials have no a good adhesion to metal bases and may be easily peeled off.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary coating, article coated with the coating and method for manufacturing the article. Moreover, in the drawings like reference numerals designate corresponding parts throughout the several views. Wherever possible, the same reference numbers are used throughout the drawings to refer to the same or like elements of an embodiment.

DETAILED DESCRIPTION

A coating 30 includes a deposited layer 31. The deposited layer 31 is a nickel-titanium carbonitride (NiTiCN) layer. The deposited layer 31 may be deposited by magnetron sputtering or cathodic arc deposition.

The deposited layer 31 has a thickness ranging from about 0.5 micrometer to about 3 micrometers. It is to be understood that the coating may also include a color layer 33 covering on the deposited layer 31, to decorate the appearance of the coating 30.

Figure 1:
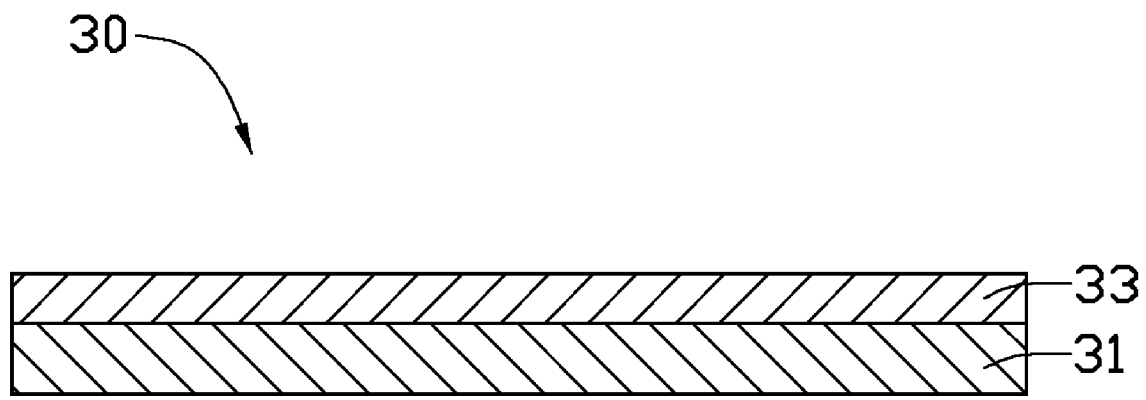
FIG. 1 is a cross-sectional view of an exemplary embodiment of coating.
Figure 2:
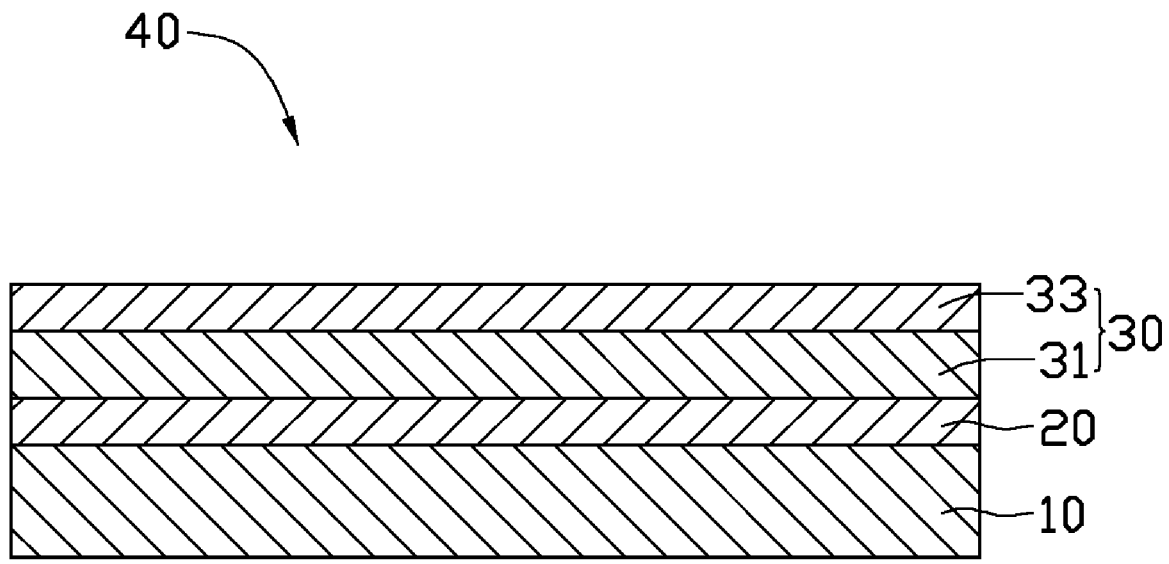
FIG. 2 is a cross-sectional view of an article coated with the coating in FIG. 1.

Referring to FIG. 2, an exemplary article 40 includes a substrate 10, a bonding layer 20 deposited on the substrate 10 and the coating 30 deposited on the bonding layer 20. The substrate 10 is made of metallic element, such as high speed steel, hard alloy, or stainless steel. The article 40 may be cutting tools, mold, or housings of electronic devices. The bonding layer 20 is a nickel titanium (NiTi) layer. The bonding layer 20 has a thickness ranging from about 0.05 micrometer to about 0.5 micrometer. The bonding layer 20 can be deposited by magnetron sputtering or cathodic arc deposition. The chemical stability of the bonding layer 20 is between the chemical stability of the substrate 10 and the chemical stability of the coating 30, and the coefficient of thermal expansion of the bonding layer 20 is between the coefficient of thermal expansion of the substrate 10 and the coefficient of thermal expansion of the coating 30. Thus, the bonding layer 20 is used to improve binding between the substrate 10 and the coating 30 so the coating 30 can be firmly deposited on the substrate 10.

Figure 3:
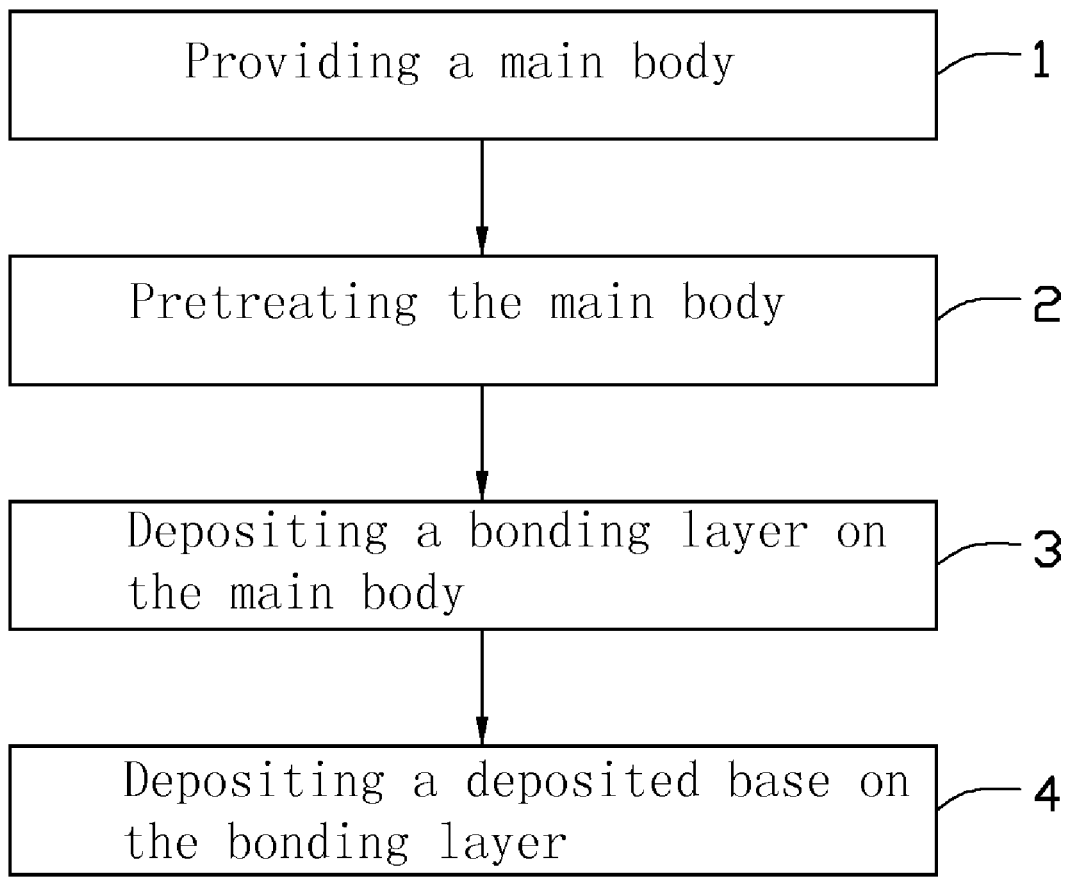
FIG. 3 is a diagram for manufacturing the article in FIG. 2.
Figure 4:
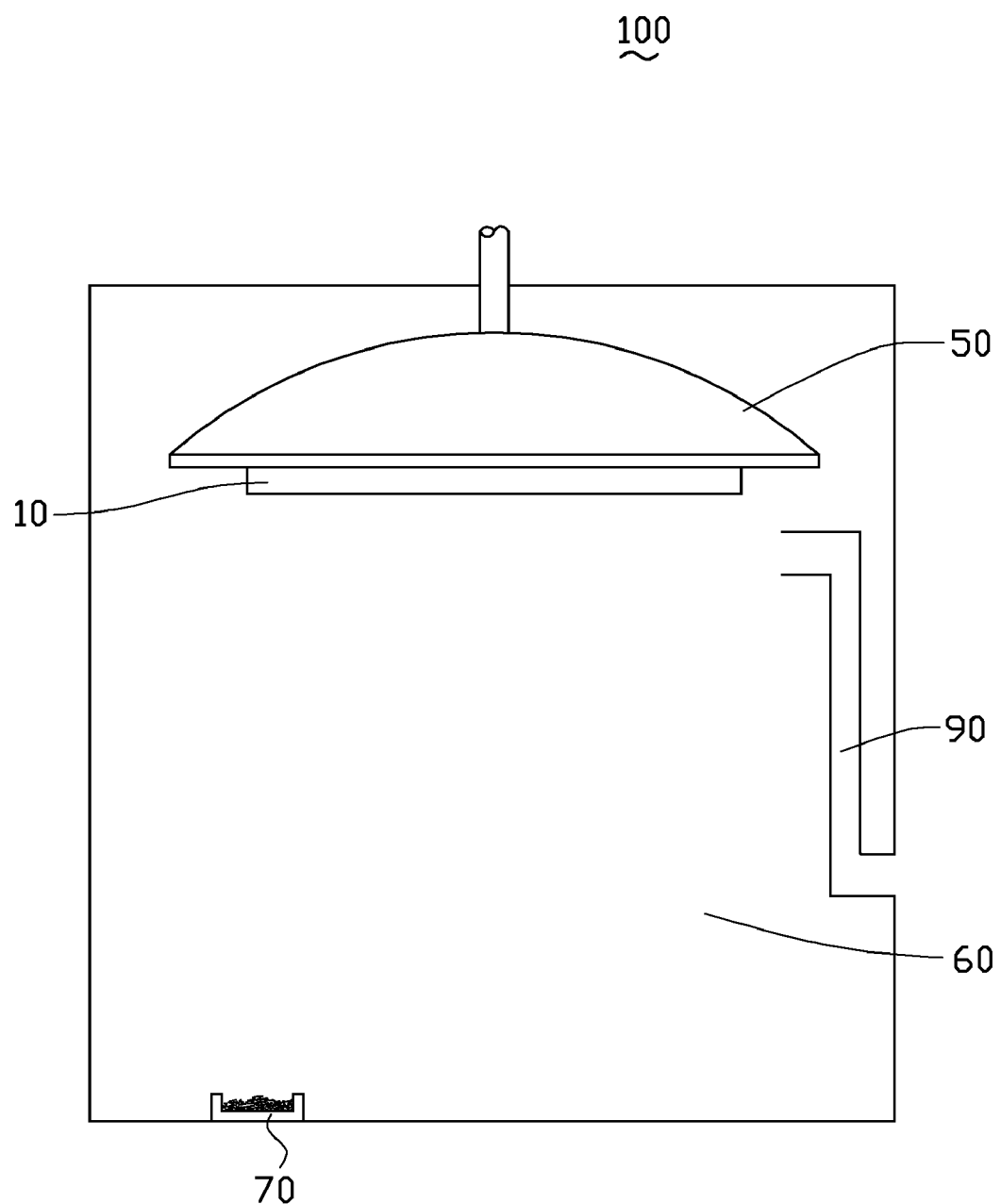
FIG. 4 is a schematic view of a magnetron sputtering coating machine for manufacturing the article in FIG. 2.

Referring to FIG. 3, a method for manufacturing the article 40 includes steps of:

Step 1 provides the substrate 10. The substrate 10 may be made of high speed steel, hard alloy, or stainless steel.

Step 2 pretreats the substrate 10. Firstly, the substrate 10 is washed with a solution (e.g., Alcohol or Acetone) in an ultrasonic cleaner, so as to remove, e.g., grease, dirt, and/or impurities. Secondly, the substrate 10 is dried. Thirdly, the substrate 10 is cleaned by argon plasma cleaning. The substrate 10 is retained on a rotating bracket 50 in a vacuum chamber 60 of a magnetron sputtering coating machine 100. The vacuum level of the vacuum chamber 60 is adjusted to about $8.0\times10^{-3}$ Pa, pure argon is fed into the vacuum chamber 60 at a flux of about 300 sccm (Standard Cubic Centimeters per Minute) to 600 sccm from a gas inlet 90, and a bias voltage is applied to the substrate 10 in a range from −300 to −800 volts for a time of about 2-8 minutes. So the substrate 10 is washed by argon plasma, to further remove the grease or dirt. Thus, an adhesive force between the substrate 10 and the bonding layer 20 is enhanced.

Step 3 is implemented to deposit the bonding layer 20 on the substrate 10. The argon is fed into the vacuum chamber 60 at a flux from about 100 sccm to 300 sccm from the gas inlet 90, preferably at about 150 sccm; a nickel titanium alloy target 70 is evaporated; a bias voltage applied to the substrate 10 may be in a range from −100 to −300 volts for a time of about 20 to 60 min, to deposit the bonding layer 20 on the substrate 10. The nickel titanium alloy contains nickel in a range from about 20 to about 80 wt %.

Step 4 deposits the deposited layer 31 on the bonding layer 20. The temperature in the vacuum chamber 60 is adjusted to 100~200° C.; nitrogen is fed into the vacuum chamber 60 at a flux from about 10 sccm to about 100 sccm and acetylene gas is fed into the vacuum chamber 60 at a flux from about 10 sccm to about 100 sccm from the gas inlet 90; the nickel titanium alloy target 70 is continuously evaporated in a power from 7 kw to 11 kw for a time from 90 min to 200 min, to deposit the deposited layer 31 on the bonding layer 20.

It is to be understood that the color layer 33 may be deposited on the deposited layer 31 to improve the appearance of the article 40.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An article, comprising:
   a substrate;
   a bonding layer deposited on the substrate; and
   a deposited layer, wherein the deposited layer is a nickel-titanium carbonitride layer.

2. The article as claimed in claim 1, wherein the deposited layer has a thickness ranging from about 0.5 micrometer to about 3 micrometer.

3. The article as claimed in claim 1, wherein the coating further comprises a color layer covering on the deposited layer, to decorate the appearance of the coating.

4. The article as claimed in claim 1, wherein the substrate is made of high speed steel, hard alloy, or stainless steel.

5. The article as claimed in claim 1, wherein the bonding layer is a nickel titanium layer, the bonding layer has a thickness ranging from about 0.05 micrometer to about 0.2 micrometer.

6. The article as claimed in claim 1, wherein the chemical stability of the bonding layer is between the chemical stability of the substrate and the chemical stability of the coating, and the coefficient of thermal expansion of the bonding layer is between the coefficient of thermal expansion of the substrate and the coefficient of thermal expansion of the coating.

7. A method for manufacturing an article comprising steps of:
   providing a substrate made of high speed steel, hard alloy, or stainless steel;
   depositing a bonding layer on the substrate by magnetron sputtering, wherein the bonding layer is a nickel titanium layer; and
   depositing a deposited layer on the bonding layer, wherein the deposited layer is a nickel-titanium carbonitride layer.

8. The method of claim 7, wherein during depositing a bonding layer on the substrate, the substrate is retained in a vacuum chamber 60 of a magnetron sputtering coating machine 100; argon is fed into the vacuum chamber 60 at a flux from about 100 sccm to 300 sccm; a bias voltage applied to the substrate is in a range from −100 to −300 volts for a time of about 20 to 60 min, to deposit the bonding layer on the substrate.

9. The method of claim 7, wherein the nickel titanium layer contains nickel in a range from about 20 to about 80 wt %.

10. The method of claim 7, wherein during depositing a deposited layer on the bonding layer, the temperature in the vacuum chamber 60 is adjusted to 100~200° C.; nitrogen is fed into the vacuum chamber 60 at a flux from about 10 sccm to about 100 sccm and acetylene gas is fed into the vacuum chamber 60 at a flux from about 10 sccm to about 100 sccm; a nickel titanium alloy target is evaporated in a power from 7 kw to 11 kw for a time from 90 min to 200 min, to deposit the deposited layer on the bonding layer.

11. The method of claim 7, further including a step of pretreating the substrate between providing a substrate and depositing a bonding layer on the substrate, the step of pretreating the substrate includes a first step which the substrate is washed with a solution in an ultrasonic cleaner to remove grease, dirt, and/or impurities.

12. The method of claim 11, wherein the step of pretreating the substrate further includes a second step which the substrate is dried.

13. The method of claim 12, wherein the step of pretreating the substrate further includes a third step which the substrate is retained on a rotating bracket 50 in a vacuum chamber 60 of a magnetron sputtering coating machine 100; the vacuum level of the vacuum chamber 60 is adjusted to about $8.0 \times 10^{-3}$ Pa, pure argon is fed into the vacuum chamber 60 at a flux of about 300 sccm to 600 sccm, and a bias voltage is applied to the substrate in a range from −300 to −800 volts for a time of about 2-8 minutes, so the substrate is washed by argon plasma.

* * * * *